(12) United States Patent
Ezekwe et al.

(10) Patent No.: US 8,395,418 B2
(45) Date of Patent: Mar. 12, 2013

(54) VOLTAGE SENSING CIRCUIT WITH REDUCED SUSCEPTIBILITY TO GAIN DRIFT

(75) Inventors: Chinwuba Ezekwe, Albany, CA (US); Johan Vanderhaegen, Sunnyvale, CA (US)

(73) Assignee: Robert Bosch GmbH, Stuttgart (DE)

(*) Notice: Subject to any disclaimer, the term of this patent is extended or adjusted under 35 U.S.C. 154(b) by 92 days.

(21) Appl. No.: 12/939,772

(22) Filed: Nov. 4, 2010

(65) Prior Publication Data

US 2012/0112797 A1    May 10, 2012

(51) Int. Cl.
*H02M 11/00*    (2006.01)
*H03F 3/45*    (2006.01)

(52) U.S. Cl. .......................... 327/103; 330/9
(58) Field of Classification Search .............. 327/103; 330/9
See application file for complete search history.

(56) References Cited

U.S. PATENT DOCUMENTS

| | | | |
|---|---|---|---|
| 4,222,110 A | 9/1980 | Judell | |
| 5,319,266 A | 6/1994 | Chu et al. | |
| 5,654,711 A | 8/1997 | Fujimori | |
| 5,914,638 A | 6/1999 | He | |
| 6,191,648 B1 | 2/2001 | Lewicki | |
| 6,259,313 B1 | 7/2001 | Lewicki | |
| 6,657,571 B2 | 12/2003 | Gordon et al. | |
| 6,734,723 B2 | 5/2004 | Huijsing et al. | |
| 6,982,664 B1 | 1/2006 | Nairn | |
| 7,132,883 B2 | 11/2006 | Huijsing et al. | |
| 7,183,957 B1 | 2/2007 | Melanson | |
| 7,202,738 B1 * | 4/2007 | Huijsing et al. | 330/253 |
| 7,209,000 B2 | 4/2007 | Huijsing et al. | |
| 7,250,886 B1 | 7/2007 | Killat et al. | |
| RE40,106 E | 2/2008 | den Breejen | |
| 7,446,686 B2 | 11/2008 | Rueger et al. | |
| 7,535,295 B1 * | 5/2009 | Huijsing et al. | 330/9 |
| 7,617,270 B2 | 11/2009 | Nikitin | |
| 7,705,757 B2 | 4/2010 | Healy et al. | |
| 7,714,757 B2 | 5/2010 | Denison et al. | |
| 7,764,118 B2 | 7/2010 | Kusuda et al. | |
| 2005/0024245 A1 | 2/2005 | Sit et al. | |
| 2008/0095213 A1 | 4/2008 | Lin et al. | |
| 2009/0222226 A1 | 9/2009 | Baraniuk et al. | |
| 2010/0026536 A1 | 2/2010 | Yoshioka | |
| 2010/0060352 A1 | 3/2010 | Kusuda et al. | |
| 2010/0145657 A1 | 6/2010 | Kavusi et al. | |

OTHER PUBLICATIONS

Chinwuba D. Ezekwe, Bernhard E. Boser, "A Mode-Matching ΔΣ Closed-Loop Vibratory-Gyroscope Readout Interface with a 0.004°/s/√Hz Noise Floor over a 50Hz Band", IEEE International Solid-State Circuits Converence, 2008 (33 pages).

L. Richard Carley, Tamal Mukherjee, "High-Speed Low-Power Integrating CMOS Sample-and-Hold Amplifier Architecture", IEEE 1995 Cutom Integrated Circuits Conference, 1995 (4 pages).

Janos Markus et al., "Theory and Applications of Incremental ΔΣ Converters", IEEE Transactions on Circuits and Systems, Apr. 2004 (13 pages).

(Continued)

*Primary Examiner* — John Poos
(74) *Attorney, Agent, or Firm* — Maginot, Moore & Beck

(57) ABSTRACT

A voltageسensing circuit includes a voltage to current converter, an integrator, a sample and hold amplifier, and a modulator. The voltage to current converter produces a modulated current corresponding to an input voltage. The integrator demodulates the modulated current and produces a voltage sum of the demodulated current. The sample and hold amplifier samples the voltage sum and provides an output voltage corresponding to the voltage sum. The modulator modulates the output voltage and provides the modulated voltage to the voltage to current converter as a feedback voltage.

19 Claims, 6 Drawing Sheets

OTHER PUBLICATIONS

Jeroen C. Van Der Meer et al., "A fully integrated CMOS Hall sensor with a 3.65 T 3 offset for compass applications", ISSCC 2005 Session 13 (2 pages).

Chinwuba D. Ezekwe, Bernhard E. Boser, "A Mode-Matching ΔΣ Closed-Loop Vibratory-Gyroscope Readout Interface with a 0.004°/s/√Hz Noise Floor over a 50Hz Band", ISSCC 2008 Session 32 (3 pages).

International Search Report and Written Opinion in corresponding PCT application (i.e., PCT/US2011/061946), mailed Jul. 19, 2012 (12 pages).

* cited by examiner

VOLTAGE SENSING CIRCUIT WITH REDUCED SUSCEPTIBILITY TO GAIN DRIFT

TECHNICAL FIELD

This disclosure relates generally to voltage sensing circuits and, more particularly, to voltage sensing circuits at an interface between analog signal and digital signal processing domains.

BACKGROUND

Many electronic systems and applications measure voltage levels of electrical signals for various purposes. Various electronic circuits often measure the voltage levels of external electrical signals as inputs. In many cases the measured electrical signal is filtered, amplified, or otherwise modified to conform to the operational parameters of the electronic system measuring the signal. In one typical use, analog to digital converters generate a discrete digital encoding that corresponds to measured analog voltage. Once converted, the digital representation of the analog signal is available for use in a wide variety of microelectronic devices. In many cases, an intermediate voltage sensing circuit transforms the electrical signal to improve the accuracy of the analog to digital converter.

Practical implementations of voltage sensing circuits face several challenges to accurate measurement of electrical signals, particularly time varying signals. Some sources of error include offset errors, noise in the source signal and noise introduced by the voltage sensing circuit, aliasing, and gain errors. Some of these errors, such as offset and gain errors, may increase in magnitude over time.

One method of improving the accuracy of voltage sensing circuits is to modulate the electrical signal being measured, and then to demodulate the signal using a voltage to current converter. In particular, modulation and demodulation with "chopped" signals known to the art provides anti-aliasing, filtering, and sampling of the input signal. However, while this technique provides advantages, the voltage to current converter used in the demodulation process remains susceptible to gain drift over time. This drift may result in incremental errors in voltage sensing that have negative effects on circuits and electronic devices measuring electrical signals. Thus, voltage sensing circuits with improved accuracy are desirable.

SUMMARY

A voltage sensing circuit has been developed. The circuit includes a voltage to current converter having an input for receiving a modulated input voltage, an integrator having an input that is operatively connected to the voltage to current converter, a sample and hold amplifier having an input that is operatively coupled to the integrator, and a first modulator having an input that is operatively connected to the sample and hold amplifier. The voltage to current converter is configured to produce a modulated current. The integrator is configured to receive the modulated current, demodulate the modulated current, and generate a voltage sum of the demodulated current for a predetermined time period. The sample and hold amplifier is configured to sample the voltage sum received from the integrator and provide an output voltage corresponding to the voltage sum. The first modulator is configured to modulate the output voltage of the sample and hold amplifier and provide the modulated voltage as a first feedback signal to the input of the voltage to current converter.

In at least another embodiment, a voltage sensing circuit has been developed. The circuit includes a voltage to current converter having an input for receiving a modulated input voltage, an integrator having an input that is operatively connected to the voltage to current converter, a sample and hold amplifier having an input that is operatively coupled to the integrator, a first modulator having an input that is operatively connected to the sample and hold amplifier, and an incremental analog-to-digital converter having an input that is operatively connected to the sample and hold amplifier. The voltage to current converter is configured to produce a modulated current. The integrator is configured to receive the modulated current, demodulate the modulated current, and generate a voltage sum of the demodulated current for a predetermined time period. The sample and hold amplifier is configured to sample the voltage sum received from the integrator and provide an output voltage corresponding to the voltage sum. The first modulator is configured to modulate the output voltage of the sample and hold amplifier and provide the modulated voltage as a first feedback signal to the input of the voltage to current converter. The incremental analog-to-digital converter receives the output voltage of the sample and hold amplifier.

DETAILED DESCRIPTION

Figure 1:
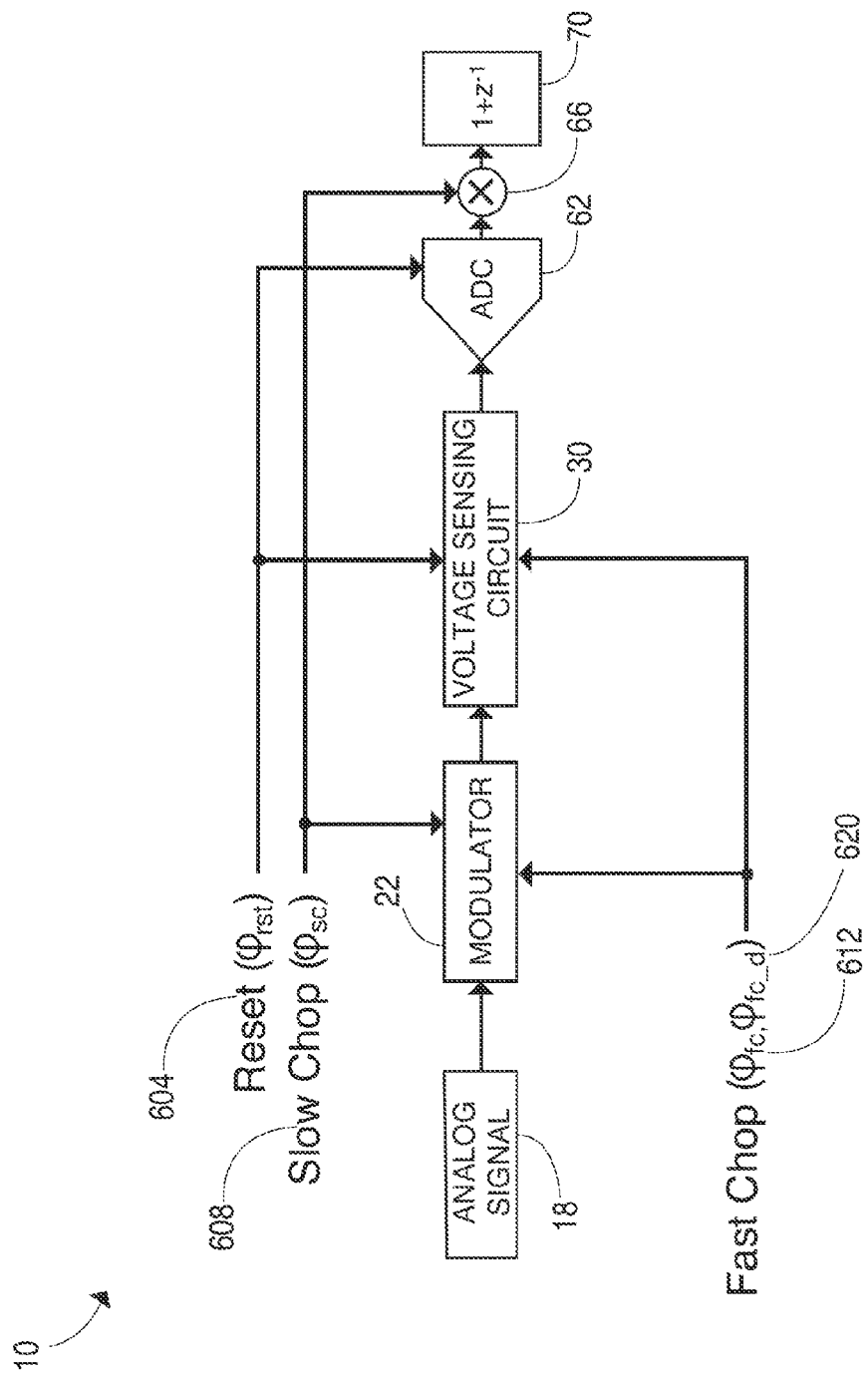
FIG. 1 is a schematic diagram of a system including a voltage sensing circuit having reduced susceptibility to gain drift.

The description below and the accompanying figures provide a general understanding of the environment for the system and method disclosed herein as well as the details for the system and method. In the drawings, like reference numerals are used throughout to designate like elements. As used in this document, the term "voltage to current converter" refers to an amplifier that outputs a current proportional to a voltage applied to an input of the amplifier. Voltage to current converters are also known as transconductance amplifiers, abbreviated as $G_m$ or $g_m$ in many schematic representations, and may also be referred to as a voltage controlled current source (VCCS). Common physical components that act as voltage to current converters include operational amplifier circuits. The term "pulse train signal" refers to an electrical signal having a series of alternating high and low voltage values that each last for predetermined period of time. The pulse train signal has a generally rectangular waveform. One common form of pulse train is a "square wave" signal that is a pulse train signal having a 50% duty cycle. The terms "integrator" and "integrating amplifier" refer to a circuit that produces a sum voltage of an input signal over a given time period. The integrator may be an inverting amplifier whose sign is the opposite of that of the sum of the input voltages. The term "sample and hold amplifier" refers to an amplifier that is configured to produce an output voltage that is proportional to a received input voltage for a predetermined time period. The sample and hold amplifier is configured to continue producing the output voltage even if the input voltage changes after being sampled. The term "chopper" refers to an electronic switch that is configured to open and close in response to a control signal, such as a pulse train signal. Choppers may modulate or demodulate an input signal.

FIG. 1 depicts a system 10 including a voltage sensing circuit 30 configured to measure a voltage of an analog signal 18 for use with an analog to digital converter (ADC) 62. System 10 includes an input configured to receive an analog signal 18, a modulator 22, voltage sensing circuit 30, ADC 62, output modulator 66, and filter 70. A reset signal 604 (FIG. 6), slow-chop signal 608 (FIG. 6), fast-chop signal 612 (FIG. 6), and delayed fast-chop signal 620 (FIG. 6) provide control input to the modulator 22, voltage sensing circuit 30, and ADC 62. An exemplary embodiment of ADC 62 includes a two-stage $\Sigma\Delta$ modulator and decimation filter, although any suitable ADC design may be used. In operation, modulator 22 modulates input signal 18. ADC 62 is configured to operate as an incremental converter that is reset in response to reset signal 604. The voltage sensing circuit 30 demodulates the modulated voltage and provides a correlated measured voltage level to the ADC 62 for each cycle of fast-chop signal 612. The modulation and demodulation filter low-frequency noise that may be present in analog signal 18 and the voltage sensing circuit 30 holds the measured voltage for conversion by ADC 62.

Reset signal 604 zeroes sensed voltages in voltage sensing circuit 30 and ADC 62 after a predetermined period of time has passed. The reset signal 604 asserts at the start of each cycle of a slow-chop signal 608, and each slow-chop signal has a cycle time period that is long enough to allow voltage sensing circuit 30 and ADC 62 to measure and digitize a series of correlated samples for a single voltage level measurement for use by decimation filter 70. Fast-chop signal 612 supplies an input signal to the modulator 22 and voltage sensing circuit 30. An example of a fast-chop signal is a pulse train signal having a frequency of 1 MHz, while the slow-chop signal 608 has a lower frequency, typically in the range of $\frac{1}{100}$ to $\frac{1}{5000}$ the frequency of the fast-chop signal. Fast-chop signal 612 and delayed fast-chop signal 620 provide the clock signals for modulation and demodulation of the analog signal 18 in the modulator 22 and voltage sensing circuit 30. While voltage modulator 22 and voltage sensing circuit 30 are shown configured to supply a sensed voltage to an ADC in FIG. 1, the same voltage modulator 22 and voltage sensing circuit may be configured for use in various other electronic circuits as well.

Figure 2:
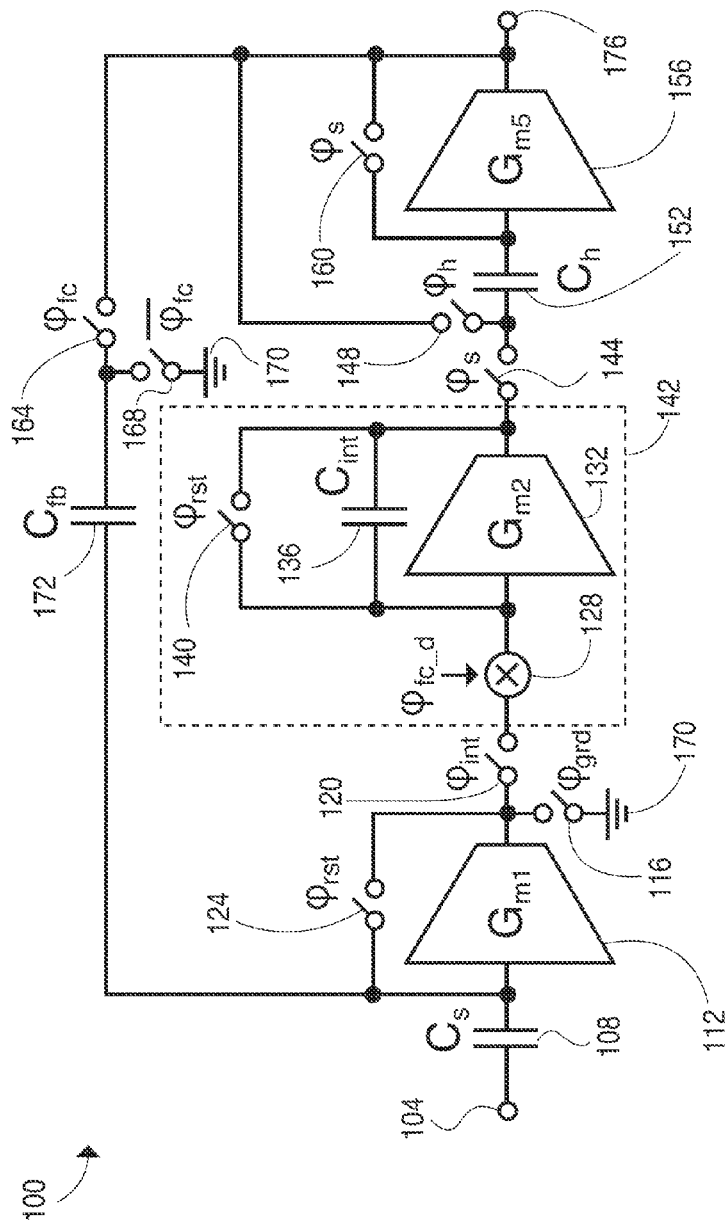
FIG. 2 is a schematic diagram of a first embodiment of a voltage sensing circuit including a feedback loop.
Figure 6:
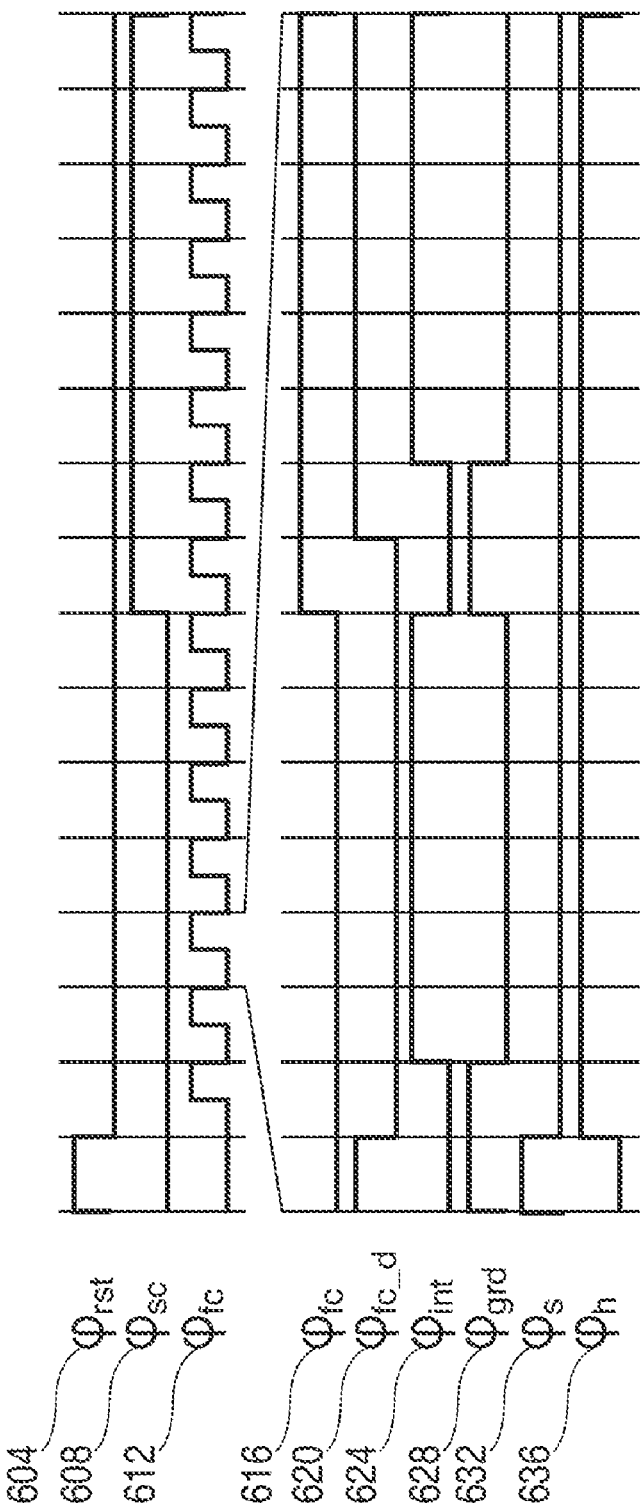
FIG. 6 is a timing diagram depicting exemplary waveforms that may be used with the circuits of FIG. 1-FIG. 5.

FIG. 2 depicts a voltage sensing circuit 100 suitable for use with the system 10 of FIG. 1. Circuit 100 includes an input terminal 104, input capacitor 108, voltage to current converter 112, integrator 142, sample-and-hold amplifier 156, feedback switches 164 and 168, feedback capacitor 172, and output terminal 176. Integrator 142 includes a demodulator 128, operational amplifier 132, integration capacitor 136, and reset switch 140. Capacitor 108 of this circuit electrically couples the modulated analog signal to the input of the voltage to current converter 112. A feedback signal, described in more detail below, is also coupled to the input of the converter 112. When the voltage sensing circuit 100 begins measuring a new voltage level, reset switch 124 closes in response to a reset signal 604 to enable input capacitor 108 to discharge and begin sampling a new voltage level. After the signal has been converted to a current signal, the signal is operated on by integrator switch 120 and ground switch 116 operating in accordance with integrator signal 624 and ground signal 628, respectively. As seen in FIG. 6, the integrator signal 624 asserts high after a delay from the edges of a single fast-chop signal 616 (FIG. 6), where the delay is known as a guard phase. During the guard phase, integrator switch 120 remains open. The guard phase delay leaves integrator switch 120 open to reject signal artifacts and noise that are generated during modulation and demodulation on the rising and falling edges of fast-chop signal 612. During the guard phase, ground switch 116 couples the output of voltage to current converter 112 to ground 170 in response to ground signal 628 (FIG. 6) to further reduce the effects of noise produced during demodulation.

With further reference to FIG. 2, the signal output through integrator switch 120 is electrically coupled to demodulator 128 and demodulated with reference to the delayed fast chop signal 620. The demodulated signal is provided to integrator 142, which integrates the signal. Switch 144 is closed by sample clock 632 to enable the integrated signal to be sampled by capacitor 152 and then input to amplifier 156. Sample clock 632 opens switch 144 and hold signal 636 closes switch 148, which enables the capacitor 152 and amplifier 156 to hold the sampled signal on the output 176. When the hold signal 636 opens switch 148, the sample and hold amplifier is prepared to sample the next integrated signal. The output signal is also modulated by the action of switches 164 and 168 operating with reference to fast chop signal 612 and its inversion. This feedback signal is electrically coupled to the input of the voltage to current converter 112 by the capacitor 172.

In one embodiment, voltage to current converter 112 is a telescopic cascode that is connected to input capacitor 108, reset switch 124, ground switch 116, and integrator switch 120. The telescopic cascode isolates noise that may be present in the input signal from the output, although any voltage to current converter that is configured to receive modulating inputs from input capacitor 108 may be used.

Demodulator 128 is embodied as a chopper in FIG. 2. The demodulator receives the output current of voltage to current converter 112 as a modulated, alternating current signal. Since the input signal received by the voltage sensing circuit 100 is modulated, the corresponding output current from voltage to current converter 112 is also modulated. The demodulator removes the modulation using a demodulation signal that corresponds to the modulation signal used to modulate the input, and also removes residual offset voltage from the voltage to current converter 112. In the example of FIG. 2, the demodulation signal is a pulse train signal having a delayed fast-chop waveform 620 that is phase-shifted by one half a cycle from the fast-chop signal 616. A similar pulse train waveform modulates the input signal prior to the signal reaching voltage to current converter 112. The delayed timing of signal 620 reduces noise introduced by the demodulator 128 when the sample-and-hold amplifier 156 samples the voltage sum of integrator 142, as is described in more detail below.

The demodulator 128 is shown as part of an integrator 142 that further includes operational amplifier 132 and integration capacitor 136. In one embodiment, the operational amplifier 132 and capacitor 136 provide a direct current gain of at least 150 dB to produce a closed-loop gain of 58 dB with 90 dB of linearity. The demodulated output current of demodulator 128 forms a charge in integrator capacitor 136 that accumulates over time as the voltage sum of the integrator 142. The voltage sum includes voltages summed from previous cycles of fast-chop signal 612 during a single period of slow-chop signal 608 as well as an additional voltage added for the current fast-chop cycle 616. A reset switch 140 zeroes the stored charge in integration capacitor 136, and consequently the voltage sum, in response to reset signal 604 at the beginning of each cycle of slow-chop signal 608.

In response to sampling signal 632, the switches 144 and 160 couple the output of the integrator to hold capacitor 152, and couple the input and output of the sample and hold amplifier 156 to one another. Hold capacitor 152 receives a charge that corresponds to the voltage sum of integrator 142. After the sample period is over, hold switch 148 couples the input of hold capacitor 152 to the output of operational amplifier 156 in response to hold signal 636 (FIG. 6) while switches 144 and 160 open. During the hold period, which lasts for the majority of the each fast-chop 616 cycle, the sample and hold amplifier 156 produces an output that corresponds to the voltage charge of hold capacitor 152. An ADC, such as ADC 62 seen in FIG. 1, or other electronic circuits may receive the output voltage through terminal 176. In systems where an ADC samples the output of sample and hold amplifier 156, each fast-chop cycle during a single slow-chop cycle produces a single sample that the ADC uses in producing a single decimated output. A typical number of fast-chop cycles 612 and samples for each slow-chop cycle 608 that generates an ADC output is 4096. After each series of fast-chop cycles, the reset signal that zeros the integration capacitor 136 also zeros hold capacitor 152, resetting the circuit 100 to begin measuring a new voltage level. The output of sample and hold amplifier 156 is also connected to feedback switch 164.

As noted above, the action of the modulator switches 164 and 168 modulates the output of the sample and hold amplifier. Switch 164 has terminals connected to the sample and hold amplifier 156 and feedback capacitor 172, while switch 168 is connected to feedback capacitor 172 and electrical ground 170. Modulator switches 164 and 168 open and close in response to the fast-chop signal 616, with switch 164 opening and closing in response to the fast-chop signal 616, while switch 168 opens and closes in response to the logical inverse of fast-chop signal 616. Thus, during the first half of each cycle of fast-chop signal 616, switch 168 couples feedback capacitor 172 with ground 170, and during the second half of fast-chop cycle 616, switch 164 couples the output of the sample and hold amplifier 156 to the feedback capacitor 172. The operation of switches 164 and 168 applies a square wave modulation to the output signal of the sample and hold amplifier 156, providing a modulated voltage signal using the same modulation technique as the modulated input signal supplied to the voltage to current converter 112. Switches 164 and 168 are merely illustrative of one modulation circuit, and other embodiments, including using a single three-pole switch, are also envisioned.

The output of feedback capacitor 172 connects to the input of the voltage to current converter 112. In operation, the voltage to current converter 112 may experience gain drift. The modulated feedback signal reduces or eliminates the effect of the gain drift on the output voltage produced by the sample and hold amplifier 156 by applying a negative feedback to cancel the effects of gain drift in the input to voltage to current converter 112. The modulation in the feedback loop enables the use of feedback capacitor 172 in the feedback loop. The feedback capacitor 172 and input capacitor 108 enable noiseless summation of the input voltage signal while also providing a high-impedance load to analog signal source driving the input terminal 104 using a single input stage.

Figure 3:
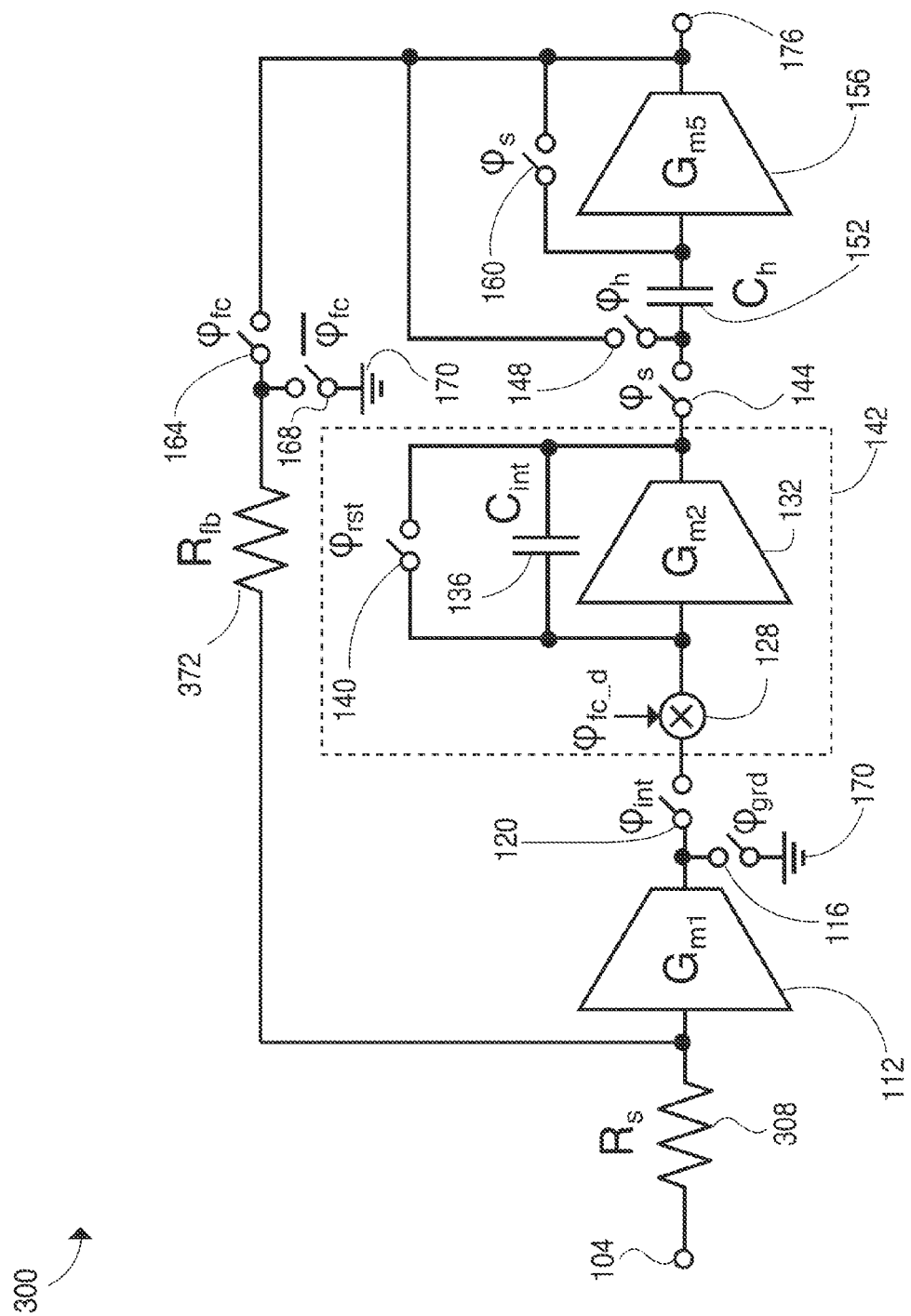
FIG. 3 is a schematic diagram of an alternative embodiment of the voltage sensing circuit of FIG. 2.

FIG. 3 depicts an alternative voltage sensing circuit 300. The circuit 300 includes the input terminal 104, voltage to current converter 112, demodulator 128, operational amplifier 132, integration capacitor 136, hold capacitor 152, sample-and-hold amplifier 156, feedback switches 164 and 168, and output terminal 176 described above with reference to FIG. 2. Circuit 300 includes an input resistor 308 and feedback resistor 372, which replace the input capacitor 108 and feedback capacitor 172, respectively. Due to the memoryless nature of input resistor 308, circuit 300 omits the reset switch 124 used to zero input capacitor 108 in FIG. 2.

Figure 4:
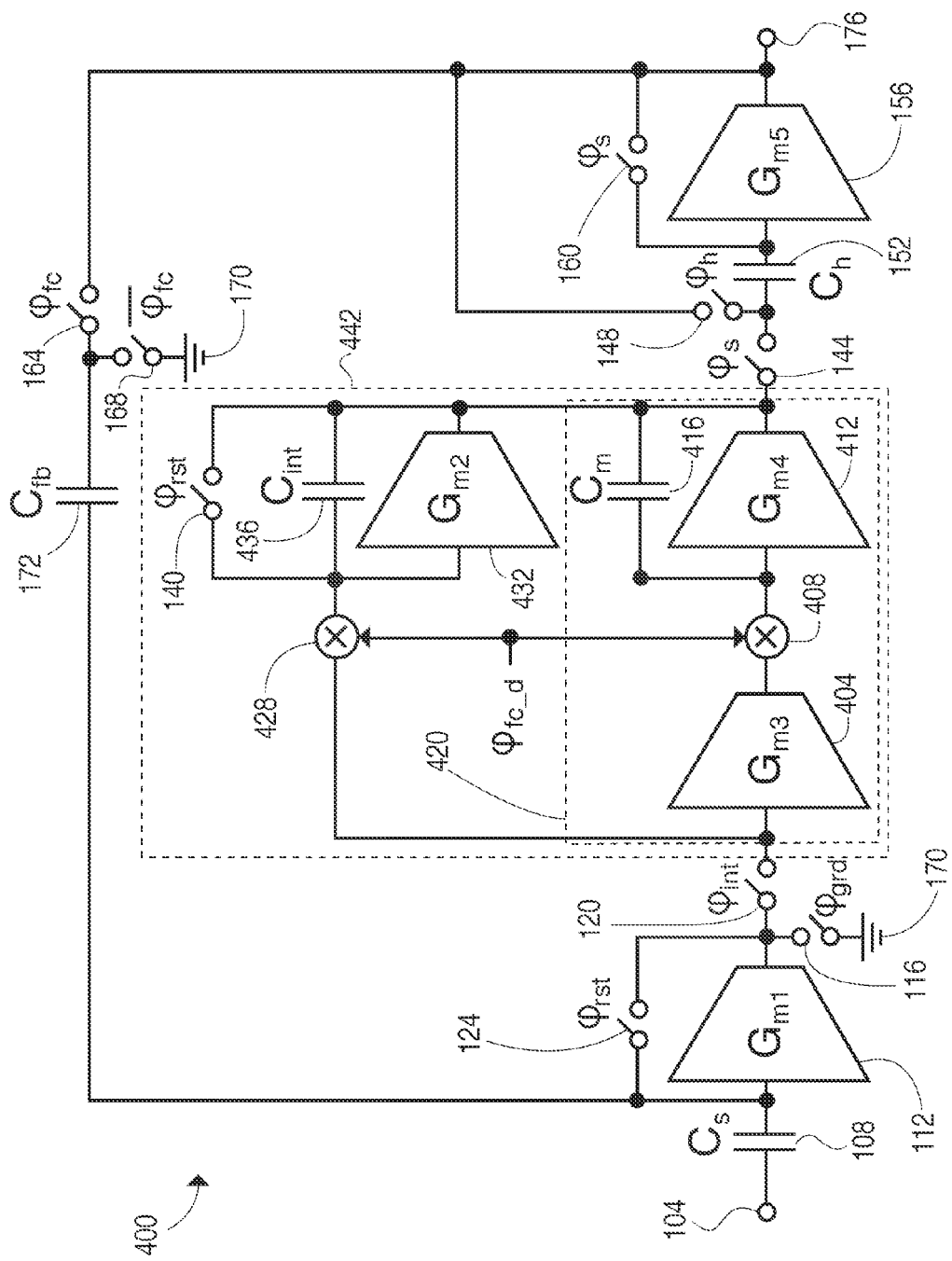
FIG. 4 is a schematic diagram of an embodiment of a voltage sensing circuit including a feedback loop and a two-stage Miller operational amplifier circuit.

FIG. 4 depicts a voltage sensing circuit 400 with a two-stage Miller amplifier used in an integrator 442. Circuit 400 shares common components with the circuit 100 seen in FIG. 2, including an input terminal 104, input capacitor 108, voltage to current converter 112, hold capacitor 152, sample-and-hold amplifier 156, feedback switches 164 and 168, feedback capacitor 172, and output terminal 176. Integrator 442 includes demodulator 428, amplifier 432, integration capacitor 436, reset switch 140, and a two-stage Miller operational amplifier 420 that further includes a first-stage operational amplifier 404, second demodulator 408, second stage operational amplifier 412, and Miller capacitor 416.

The two-stage Miller amplifier 420 and integration capacitor 436 produces a voltage sum for integrator 442. The first-stage operational amplifier 404 amplifies the modulated current received from voltage to current converter 112 through the integrator switch 120. The amplified modulated current is an alternating current. The second demodulator 408 demodulates the amplified modulated current from first-stage operational amplifier 404. Demodulator 408 is shown as a chopper that is similar to the chopper of demodulator 128 shown above. The delayed fast-chop signal 620 drives demodulator 408 to generate a demodulated output current for the input of the second stage operational amplifier 412. The second stage operational amplifier 412 has an output connected to the integration capacitor 436 that is coupled to hold capacitor 152 by sampling switch 144. Capacitor 416 in the Miller amplifier is a feedback capacitor connected to the output and input of operational amplifier 412.

In operation, the first stage Miller amplifier 404 amplifies the modulated current generated by voltage to current converter 112. The second stage amplifier 420 and Miller capacitor 416 provide an input voltage to the integration capacitor 436 that corresponds to the demodulated and amplified current. The integration capacitor 436 accumulates a charge over time in response to the input voltage to generate a voltage sum for the integrator 442. The voltage sum includes voltages summed from previous cycles of fast-chop signal 612 during a single period of slow-chop signal 608 as well as an additional voltage added for the current fast-chop cycle 616. A reset switch 140 zeroes the stored charge in integration capacitor 436, and consequently the voltage sum, in response to reset signal 604 at the beginning of each cycle of slow-chop signal 608.

Miller operational amplifiers 404 and 412 have a signal response that introduces a zero in the right-hand complex plane of a pole-zero plot known to those in the art. This right-hand zero is susceptible to variance during operation that could introduce inaccuracies into the integration capacitor 436 and the hold capacitor 152 over time. Integrator 442 includes amplifier 432 and demodulator 428 to partially or fully cancel the right-hand zero and stabilize the output of integrator 442. The delayed fast-chop signal drives demodulator 428, which is shown here as a chopper similar to chopper 408. Demodulator 428 demodulates the output current of voltage to current converter 112 and provides the demodulated current to amplifier 432. The output of amplifier 432 is connected to the integrator capacitor 436. The output of amplifier 432 tends to cancel the right-hand zero component in the output signal of two-stage Miller amplifier 420. Thus, the input of integration capacitor 436 receives the output of the two-stage Miller amplifier 420 with the right-hand zero signal component reduced or eliminated to provide for more accurate voltage sums. In operation, the circuit of FIG. 4 provides a similar voltage sensing function to the function described above with reference to FIG. 2.

Figure 5:
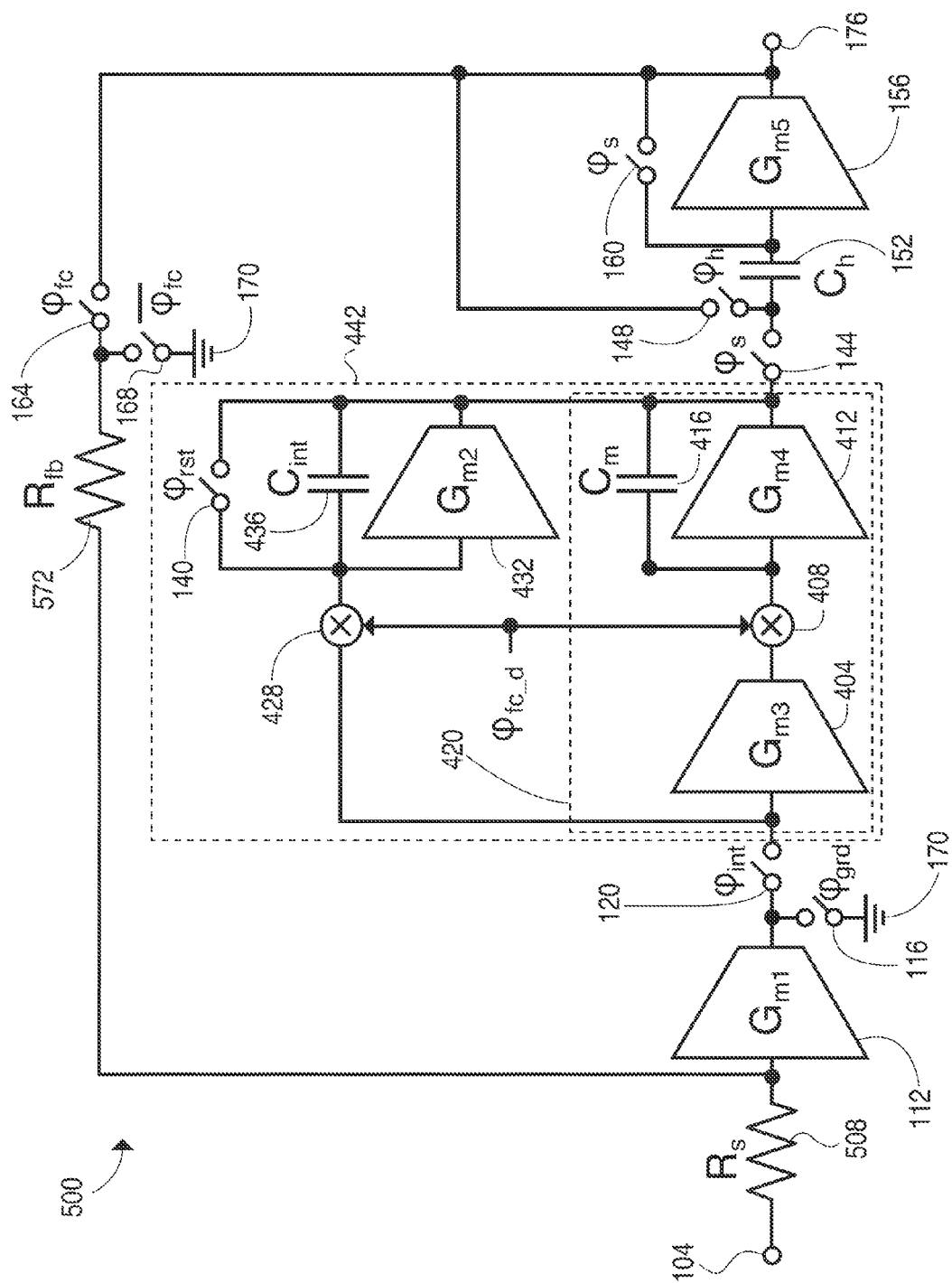
FIG. 5 is a schematic diagram of an alternative embodiment of the voltage sensing circuit of FIG. 4.

FIG. 5 depicts an alternative voltage sensing circuit 500 that is similar to the circuit of FIG. 4. The circuit 500 includes the input terminal 104, voltage to current converter 112, hold capacitor 152, sample-and-hold amplifier 156, feedback switches 164 and 168, and output terminal 176 described above with reference to FIG. 2. The circuit 500 also includes an integrator 442 having a demodulator 428, amplifier 432, integration capacitor 436, reset switch 140, and two-stage Miller amplifier 420. The two-stage Miller amplifier 420 includes first-stage amplifier 404, demodulator 408, second-stage amplifier 412, and Miller capacitor 416 as described above with reference to FIG. 4. Circuit 500 includes an input resistor 508 and feedback resistor 572 that replace the input capacitor 108 and feedback capacitor 172, respectively. Due to the memoryless nature of input resistor 508, circuit 300 omits the reset switch 124 used to zero input capacitor 108 in FIG. 4.

FIG. 6 depicts a timing diagram of control signals that are suitable for use with the circuits described above. The signals include a reset signal 604, slow-chop signal 608, fast-chop signal 612, a time-scaled representation of the fast-chop signal 616, a delayed fast-chop signal 620, integrator signal 624, ground signal 628, sample signal 632, and hold signal 636. The timing of reset signal 604 corresponds to the slow-chop signal 608 so that the reset signal asserts once for each slow-chop signal cycle. Signals 616-636 depict a time-scaled view of signal activity that occurs during a single cycle of fast-chop signal 612. When read with reference to the foregoing figures, a "high" assertion in a signal indicates that a corresponding switch is closed in response to the asserted signal. For example, integrator switch 120 is closes in response to integrator signal 624 asserting high, and opens when integrator signal 624 is low. These signals are described above with respect to particular components and operations of the circuits Those skilled in the art will recognize that numerous modifications can be made to the specific implementations described above. For example, while the embodiments of FIG. 1-FIG. 5 depict single-ended voltage sensing circuits having a single input, alternative embodiments may include differential voltage sensing circuits that are configured to sense voltage levels between a plurality of inputs. Therefore, the following claims are not to be limited to the specific embodiments illustrated and described above. The claims, as originally presented and as they may be amended, encompass variations, alternatives, modifications, improvements, equivalents, and substantial equivalents of the embodiments and teachings disclosed herein, including those that are presently unforeseen or unappreciated, and that, for example, may arise from applicants/patentees and others.

What is claimed is:

1. A voltage sensing circuit comprising:
a voltage to current converter having a telescopic cascode circuit with an input for receiving a modulated input voltage signal, the telescopic cascode circuit being configured to track a common mode input level of at least one input device to maintain substantially constant drain to source voltages in the at least one input device and to produce a modulated current;
an integrator having an input that is operatively connected to the voltage to current converter to receive the modulated current, the integrator being configured to demodulate the modulated current and to generate a voltage sum of the demodulated current for a predetermined time period;
a sample and hold amplifier having an input that is operatively coupled to the integrator to receive the voltage sum, the sample and hold amplifier being configured to sample a voltage sum received from the integrator and provide an output voltage corresponding to the voltage sum; and
a first modulator having an input that is operatively connected to the sample and hold amplifier to receive the output voltage, the first modulator being configured to modulate the output voltage of the sample and hold amplifier and provide the modulated voltage as a first feedback signal to the input of the voltage to current converter.

2. The circuit of claim 1 further comprising:
a first capacitor configured to couple the modulated input signal to the input of the telescopic cascode circuit; and
a second capacitor configured to couple the first feedback signal to the input of the telescopic cascode circuit.

3. The circuit of claim 1 further comprising:
a first resistor configured to couple the modulated input signal to the input of the telescopic cascode circuit; and
a second resistor configured to couple the first feedback signal to the input of the telescopic cascode circuit.

4. The circuit of claim 1 further comprising:
a modulation input circuit configured to modulate an input signal with a signal having a first frequency followed by a modulation of the input signal with a signal having a second frequency, the first frequency being greater than the second frequency; and
an incremental analog-to-digital converter having an input that is operatively connected to the sample and hold amplifier to receive the output voltage, the incremental analog-to-digital converter being configured to be reset with reference to a signal corresponding to the second frequency.

5. The circuit of claim 4 wherein the signal having the first frequency has a pulse train wave form.

6. The circuit of claim 4, the integrator further comprising:
a demodulator having an input that is operatively connected to the telescopic cascode circuit to receive the modulated current, the demodulator being configured to produce the demodulated current;
an operational amplifier having an input to receive the demodulated current, the operational amplifier being configured to generate a voltage; and
a capacitor having an input to receive the voltage generated by the operational amplifier, the capacitor being configured to generate the voltage sum of the demodulated current for the predetermined time period.

7. The circuit of claim 6, the demodulator being a chopper having an input to receive the modulated current, the chopper being configured to demodulate the modulated current with a delayed signal of the first frequency.

8. The circuit of claim 4, the integrator further comprising:
a first operational amplifier having an input to receive the modulated current from the telescopic cascode circuit, the first operational amplifier being configured to generate an alternating current signal;
a first demodulator having an input to receive the alternating current signal, the first demodulator being configured to generate the demodulated current;
a second operational amplifier having an input to receive the demodulated current, the second operational amplifier being configured to generate a voltage;
a capacitor having an input to receive the voltage generated by the second operational amplifier, the capacitor being configured to generate the voltage sum of the demodulated current for the predetermined time period;
a second demodulator having an input to receive the modulated current from the telescopic cascode circuit, the second demodulator being configured to generate a second demodulated current; and
a third operational amplifier having an input to receive the second demodulated current, the third operational amplifier being configured to produce an offset cancellation voltage that is coupled to the input of the capacitor to modify the voltage sum, the offset cancellation voltage corresponds to a component of the voltage generated by the second operational amplifier.

9. The circuit of claim 8 further comprising:
the first demodulator being a first chopper having an input to receive the alternating current signal, the first chopper being configured to demodulate the alternating current signal with a delayed signal of the first frequency; and the second demodulator being a second chopper having an input to receive the alternating current signal, the second chopper being configured to demodulate the alternating current signal with the delayed signal of the first frequency.

10. The circuit of claim 1, the modulator further comprising:

a switching circuit operatively connected to the sample and hold amplifier and operated with the signal having the first frequency to produce the first feedback signal.

11. A voltage sensor circuit comprising:

a voltage to current converter having an input for receiving a modulated input voltage signal, the voltage to current converter being configured to produce a modulated current;

an integrator having an input that is operatively connected to the voltage to current converter to receive the modulated current, the integrator being configured to demodulate the modulated current and to generate a voltage sum of the demodulated current for a predetermined time period;

a sample and hold amplifier having an input that is operatively coupled to the integrator to receive the voltage sum, the sample and hold amplifier being configured to sample a voltage sum received from the integrator and provide an output voltage corresponding to the voltage sum;

a first modulator having an input that is operatively connected to the sample and hold amplifier to receive the output voltage, the first modulator being configured to modulate the output voltage of the sample and hold amplifier and provide the modulated voltage as a first feedback signal to the input of the voltage to current converter; and an incremental analog-to-digital converter having an input that is operatively connected to the sample and hold amplifier to receive the output voltage,.

12. The circuit of claim 11, the integrator further comprising:

a first operational amplifier having an input to receive the modulated current of the voltage to current converter, the first operational amplifier being configured to generate an alternating current signal;

a first demodulator having an input to receive the alternating current signal, the first demodulator being configured to generate a demodulated current;

a second operational amplifier having an input to receive the demodulated current, the second operational amplifier being configured to generate a voltage;

a capacitor having an input to receive the voltage generated by the second operational amplifier, the capacitor being configured to generate the voltage sum of the demodulated current for the predetermined time period;

a second demodulator having an input to receive the modulated current of the voltage to current converter, the second demodulator being configured to generate a second demodulated current; and a third operational amplifier having an input to receive the second demodulated current, the third operational amplifier being configured to produce an offset cancellation voltage that is coupled to the input of the capacitor to modify the voltage sum, the offset cancellation voltage corresponds to a component of the voltage generated by the second operational amplifier.

13. The circuit of claim 12 further comprising:

a modulation input circuit configured to modulate an input signal with a signal having a first frequency followed by a modulation of the input signal with a signal having a second frequency, the first frequency being greater than the second frequency; and wherein the incremental analog-to-digital converter is configured to be reset with reference to a signal corresponding to the second frequency.

14. The circuit of claim 13 further comprising:

the first demodulator being a first chopper having an input to receive the alternating current signal, the first chopper being configured to demodulate the alternating current signal with a delayed signal of the first frequency; and the second demodulator being a second chopper having an input to receive the alternating current signal, the second chopper being configured to demodulate the alternating current signal with the delayed signal of the first frequency.

15. The circuit of claim 13 wherein the signal having the first frequency has a pulse train wave form.

16. The circuit of claim 11 the voltage to current converter further comprising:

a telescopic cascode circuit configured to receive the modulated input signal and track a common mode input level of at least one input device to maintain substantially constant drain to source voltages in the at least one input device.

17. The circuit of claim 11 further comprising:

a first capacitor configured to couple the modulated input signal to the input of the voltage to current converter; and a second capacitor configured to couple the first feedback signal to the input of the voltage to current converter.

18. The circuit of claim 11 further comprising:

a first resistor configured to couple the modulated input signal to the input of the voltage to current converter; and a second resistor configured to couple the first feedback signal to the input of the voltage to current converter.

19. The circuit of claim 11, the modulator further comprising:

a switching circuit operatively connected to the sample and hold amplifier and operated with the signal having the first frequency to produce the first feedback signal.

* * * * *